United States Patent
Kim et al.

(10) Patent No.: US 9,373,816 B2
(45) Date of Patent: Jun. 21, 2016

(54) ORGANIC LIGHT EMITTING DIODE DISPLAY AND MANUFACTURING METHOD OF ORGANIC LIGHT EMITTING DIODE DISPLAY

(71) Applicant: Samsung Display Co., Ltd., Yongin, Gyeonggi-do (KR)

(72) Inventors: Jin-Kwang Kim, Yongin (KR);
Sang-Joon Seo, Yongin (KR);
Seung-Hun Kim, Yongin (KR);
Yong-Hwan Park, Yongin (KR);
Jun-Hyuk Cheon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/539,785

(22) Filed: Nov. 12, 2014

(65) Prior Publication Data
US 2015/0069372 A1    Mar. 12, 2015

Related U.S. Application Data

(62) Division of application No. 13/300,497, filed on Nov. 18, 2011, now abandoned.

(30) Foreign Application Priority Data

Mar. 24, 2011 (KR) .................. 10-2011-0026579

(51) Int. Cl.
*H01L 33/00* (2010.01)
*H01L 51/52* (2006.01)

(52) U.S. Cl.
CPC .................. *H01L 51/5253* (2013.01)

(58) Field of Classification Search
CPC ..... H01L 33/52; H01L 51/107; H01L 51/448; H01L 51/5237
USPC .......................... 257/40, 59, 72, 98
See application file for complete search history.

(56) References Cited

U.S. PATENT DOCUMENTS

| | | | |
|---|---|---|---|
| 2008/0150419 A1 | 6/2008 | Kang | |
| 2009/0305062 A1 | 12/2009 | Choi et al. | |
| 2010/0176382 A1 | 7/2010 | Park et al. | |
| 2011/0140163 A1 | 6/2011 | Oh et al. | |
| 2012/0228668 A1* | 9/2012 | Thoumazet | C23C 16/0245 257/100 |

FOREIGN PATENT DOCUMENTS

| | | |
|---|---|---|
| JP | 2001-284042 | 10/2001 |
| KR | 10-0508990 B | 8/2005 |
| KR | 10-0647705 B1 | 11/2006 |

* cited by examiner

*Primary Examiner* — Tan N Tran
(74) *Attorney, Agent, or Firm* — Lewis Roca Rothgerber Christie LLP

(57) ABSTRACT

An organic light emitting diode (OLED) display includes: a substrate; an organic light emitting diode on the substrate; and a thin film encapsulation layer including a first inorganic layer having a first density on the substrate and a second inorganic layer having a second density on the first inorganic layer, the second density being different from the first density, and the organic light emitting diode being encapsulated between the thin film encapsulation layer and the substrate.

7 Claims, 7 Drawing Sheets

ORGANIC LIGHT EMITTING DIODE DISPLAY AND MANUFACTURING METHOD OF ORGANIC LIGHT EMITTING DIODE DISPLAY

CROSS-REFERENCE TO RELATED APPLICATION

This application is a divisional of U.S. patent application Ser. No. 13/300,497, filed Nov. 18, 2011, which claims priority to and the benefit of Korean Patent Application No. 10-2011-0026579 filed in the Korean Intellectual Property Office on Mar. 24, 2011, the entire contents of both of which are incorporated herein by reference.

BACKGROUND

1. Field

The present invention relates generally to a manufacturing method of an organic light emitting diode (OLED) display.

2. Description of Related Art

Display devices display images, and recently, an organic light emitting diode display has been in the spotlight.

The organic light emitting diode display has a self-emitting characteristic and does not need a separate light source such that the thickness and weight thereof are reduced in comparison to a liquid crystal display. In addition, the organic light emitting diode display has low power consumption, high luminance, high response speed, and the like.

In general, the OLED display includes a substrate, a plurality of organic light emitting diodes disposed on the substrate for displaying an image, and an encapsulation member facing the substrate while encapsulating the organic light emitting diodes therebetween.

Recently, an OLED display using a thin film encapsulation layer as an encapsulation member has been developed.

The above information disclosed in this Background section is only for enhancement of understanding of the background of the present invention, and therefore it may contain information that does not form the prior art that is already known in this country to a person of ordinary skill in the art.

SUMMARY

Aspects of embodiments according to the present invention are directed toward an organic light emitting diode (OLED) display having improved light efficiency, and a manufacturing method of an OLED display.

In addition, aspects of the embodiments are directed toward an OLED display of which a manufacturing time and manufacturing cost are reduced, and a manufacturing method of an OLED display.

Other aspects of the embodiments are directed toward an OLED display of which the life span is improved by enhancing durability, and a manufacturing method of an OLED display.

According to a first embodiment of the present invention, an OLED display includes: a substrate; an organic light emitting diode on the substrate; and a thin film encapsulation layer including a first inorganic layer having a first density on the substrate, and a second inorganic layer having a second density on the first inorganic layer, the second density being different from the first density, the organic light emitting diode being encapsulated between the thin film encapsulation layer and the substrate.

The first inorganic layer and the second inorganic layer may include a same inorganic material.

The inorganic material may include at least one material selected from the group consisting of aluminum oxide ($Al_2O_3$), titanium oxide ($TiO_2$), zirconium oxide (ZrO), silicon oxide ($SiO_2$), aluminum oxynitride (AlON), aluminum nitride (AlN), silicon oxynitride (SiON), silicon nitride ($Si_3N_4$), zinc oxide (ZnO), tantalum oxide ($Ta_2O_5$), and combinations thereof.

The first density may be greater than the second density, and internal stress of the first inorganic layer may be greater than that of the second inorganic layer.

The second density may be greater than the first density, and internal stress of the second inorganic layer may be greater than that of the first inorganic layer.

The first inorganic layer and the second inorganic layer may contact each other.

The thin film encapsulation layer may further include an intermediate layer between the organic light emitting diode and the first inorganic layer, between the first inorganic layer and the second inorganic layer, or above the second inorganic layer.

The intermediate layer may have at least one of a first surface contacting the first inorganic layer or a second surface contacting the second inorganic layer, and the intermediate layer may have a first density that is gradually changed from another density from another surface of the intermediate layer to the first surface, may have a second density that is gradually changed from the first density from the first surface of the intermediate layer to the second surface, or may have another density that is gradually changed from the second density from the second surface of the intermediate layer to further another surface.

The intermediate layer may include an inorganic material that is the same as that of the first and second inorganic layers.

Each of the first and second inorganic layers may be formed through an ALD process.

According to a second embodiment of the present invention, a manufacturing method of an OLED display includes: forming an organic light emitting diode on a substrate; and forming a thin film encapsulation layer encapsulating the organic light emitting diode with the substrate on the substrate by forming a first inorganic layer using a deposition process on the substrate in a first temperature environment and forming a second inorganic layer using a deposition process on the first inorganic layer in a second temperature environment that is different from the first temperature environment.

The first inorganic layer and the second inorganic layer may be formed using a same inorganic material.

The inorganic material may include at least one material selected from the group consisting of aluminum oxide ($Al_2O_3$), titanium oxide ($TiO_2$), zirconium oxide (ZrO), silicon oxide ($SiO_2$), aluminum oxynitride (AlON), aluminum nitride (AlN), silicon oxynitride (SiON), silicon nitride ($Si_3N_4$), zinc oxide (ZnO), tantalum oxide ($Ta_2O_5$), and combinations thereof.

A temperature of the first temperature environment may be lower than that of the second temperature environment.

A temperature of the second temperature environment may be lower than that of the first temperature environment.

The second inorganic layer may be formed to contact the first inorganic layer.

The forming of the thin film encapsulation layer may further include forming an intermediate layer at least between the organic light emitting diode and the first inorganic layer, between the first inorganic layer and the second inorganic layer, or on the second inorganic layer.

The intermediate layer may be formed in the first temperature environment that gradually changes from a temperature of a surface of the intermediate layer to the first surface, may be formed in the second temperature environment that gradually changes from a first temperature of the first surface of the intermediate layer to the second surface, or may be formed in another temperature environment that gradually changes from a second temperature of the second surface of the intermediate layer to yet another surface.

The intermediate layer may be formed using an inorganic material that is the same as that of the first and second inorganic layers.

The deposition process may include an ALD process.

According to the exemplary embodiments, an OLED display having improved light efficiency and a manufacturing method of an OLED display can be provided.

Further, an OLED display of which a manufacturing time and manufacturing cost are reduced, and a manufacturing method of an OLED display can be provided.

Further, an OLED display with improved life-span and enhanced durability, and a manufacturing method of an OLED display can be provided.

DETAILED DESCRIPTION OF THE EMBODIMENTS

Figure 1:
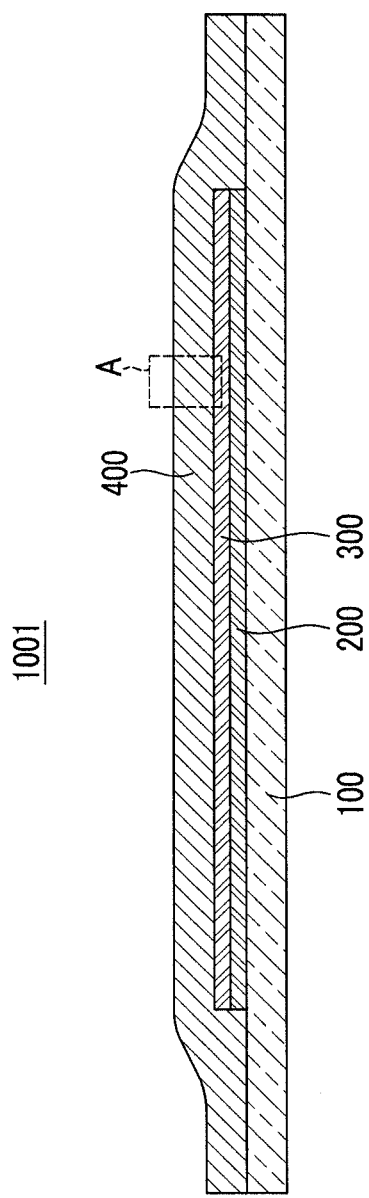
FIG. 1 schematically shows an organic light emitting diode (OLED) display according to a first exemplary embodiment.

Hereinafter, the present invention will be described more fully with reference to the accompanying drawings, in which exemplary embodiments of the invention are shown. As those skilled in the art would realize, the described embodiments may be modified in various different ways, all without departing from the spirit or scope of the present invention.

In order to elucidate the present invention, parts that are not related to the description will be omitted. Like reference numerals designate like elements throughout the specification.

In addition, the size and thickness of each component shown in the drawings are arbitrarily shown for understanding and ease of description, but the present invention is not limited thereto.

In the drawings, the thicknesses of layers, films, panels, regions, etc., are exaggerated for clarity. In addition, in the drawings, for understanding and ease of description, the thicknesses of some layers and areas are exaggerated. It will be understood that when an element such as a layer, film, region, or substrate is referred to as being "on" another element, it may be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, throughout the specification, "on" implies being positioned above or below a target element and does not imply being necessarily positioned on the top with respect to a gravity direction.

Hereinafter, an organic light emitting diode (OLED) display according to a first exemplary embodiment will be described with reference to FIG. 1 to FIG. 4.

FIG. 1 shows an OLED display according to the first exemplary embodiment.

As shown in FIG. 1, an OLED display 1001 according to the first exemplary embodiment includes a substrate 100, a wiring portion 200, organic light emitting diodes 300, and a thin film encapsulation layer 400.

The substrate 100 is formed with a material including glass, resin, or metal, and the material is light-transmissive, light-reflective, light-absorptive, or light-semitransmissive. The wiring portion 200 and the organic light emitting diodes 300 are disposed on the substrate 100, and the substrate 100 and the thin film encapsulation layer 400 encapsulate the organic light emitting diodes 300 and the wiring portion 200 therebetween. The substrate 100 and the thin film encapsulation layer 400 protect the wiring portion 200 and the organic light emitting diodes 300 from external interference. The substrate 100 may have flexibility, and when the thin film encapsulation layer 400 is formed as a thin film on a flexible substrate 100, the OLED display 1001 has flexibility.

The wiring portion 200 includes first and second thin film transistors 10 and 20 (shown in FIG. 2) in each pixel, and drives the organic light emitting diodes 300 by transmitting a signal to each of the organic light emitting diodes 300. The organic light emitting diodes 300 emit light according to the signal transmitted from the wiring portion 200 to display an image.

The organic light emitting diodes 300 are disposed on the wiring portion 200.

The organic light emitting diodes 300 are disposed on the substrate 100, and display an image by emitting light in accordance with the signal transmitted from the wiring portion 200.

Hereinafter, an internal structure of the OLED display 1001 according to the first exemplary embodiment will be described in more detail with reference to FIG. 2 and FIG. 3.

Figure 2:
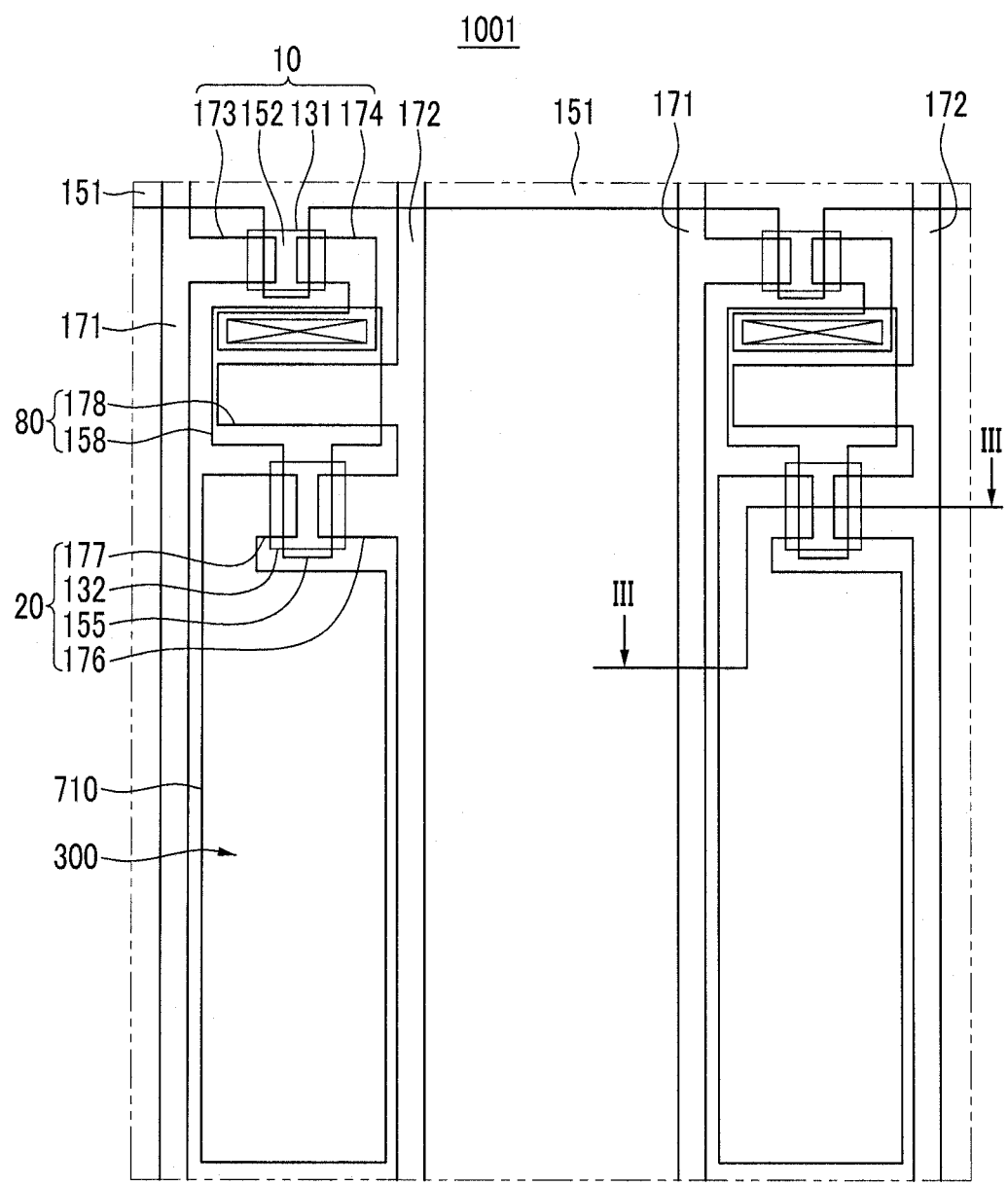
FIG. 2 is a layout view showing a pixel structure of the OLED display according to the first exemplary embodiment.

FIG. 2 is a layout view of a pixel structure of the OLED display according to the first exemplary embodiment. FIG. 3 is a cross-sectional view of FIG. 2, taken along the line III-III.

Figure 3:
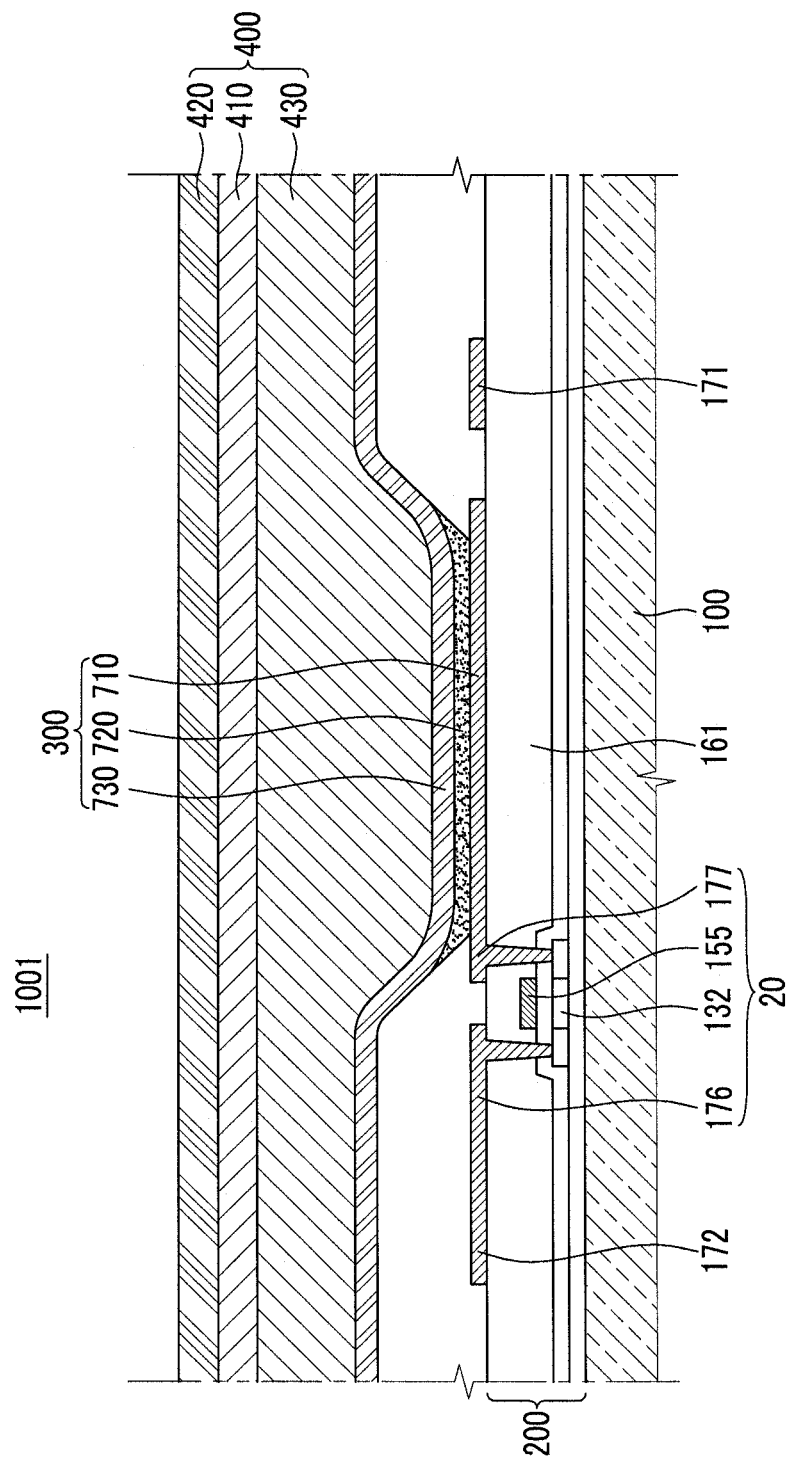
FIG. 3 is a cross-sectional view of FIG. 2, taken along the line III-III.

The structure of the wiring portion 200 and the organic light emitting diodes 300 are shown in FIG. 2 and FIG. 3, but the present exemplary embodiment is not limited to the structure shown in FIG. 2 and FIG. 3. The structure of the wiring portion 200 and the organic light emitting diodes 300 may be variously modified by a person skilled in the art. For example, in the accompanying drawing, an active matrix (AM) organic light emitting diode display having a 2Tr-1Cap structure that includes two thin film transistors (TFTs) 10 and 20 and one capacitor 80 in one pixel is shown as an OLED display, but the present invention is not limited thereto. Thus, the number of thin film transistors, the number of capacitors, and the number of wires of the OLED display is not restrictive. The pixel represents a minimum unit for displaying an image, and the OLED displays an image using a plurality of pixels.

As shown in FIG. 2 and FIG. 3, each pixel of the OLED display 1001 includes a switching thin film transistor 10, a driving thin film transistor 20, a capacitor 80, and an organic light emitting diode 300 formed in each pixel. Here, a configuration including the switching thin film transistor 10, the driving thin film transistor 20, and the capacitor 80 forms the wiring portion 200. In addition, the wiring portion 200 further includes gate lines 151 extending in one direction of the substrate 100, data lines 171, and common power lines 172. The data lines 171 and the common power lines 172 cross the gate lines 151 in an insulated manner. Here, one pixel may be defined by the boundary of the gate line 151, the data line 171, and the common power line 172, but the present invention is not limited thereto.

The organic light emitting diode 300 includes a first electrode 710, an organic emission layer 720 formed on the first electrode 710, and a second electrode 730 formed on the organic emission layer 720 and the first electrode 710. The first electrode 710, the organic emission layer 720, and the second electrode 730 form the organic light emitting diode 300. Here, the first electrode 710 may be an anode which is a hole injection electrode, and the second electrode 730 may be a cathode which is an electron injection electrode. However, the exemplary embodiment is not limited thereto, and the first electrode 710 may be a cathode and the second electrode 730 may be an anode according to a driving method of the OLED display. Holes and electrons are injected into the organic emission layer 720 respectively from the first electrode 710 and the second electrode 730. When an exciton, which is formed when a hole and an electron injected into the organic emission layer 720 are coupled to each other, falls from an excited state to a ground state, light emission occurs. In addition, at least one of the first and second electrodes 710 and 730, for example the second electrode 730, may be formed in a light transmissive structure, and accordingly, the organic light emitting diode 300 emits light toward a direction of the thin film encapsulation layer 400 to display an image.

The capacitor 80 includes a pair of capacitor plates 158 and 178 arranged with an interlayer insulating layer 161 therebetween. Here, the interlayer insulating layer 161 is a dielectric material, and capacitance of the capacitor 80 is determined by the amount of charges that can be charged in the capacitor 80 and a voltage between the two capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switch to select a pixel for light emission. The switching gate electrode 152 is connected to the gate line 151. The switching source electrode 173 is connected to the data line 171. The switching drain electrode 174 is spaced from the switching source electrode 173 and is connected with the capacitor plate 158.

The driving thin film transistor 20 applies driving power to the first electrode 710 for light emission of the organic emission layer 720 of the organic light emitting diode 300 of the selected pixel. The driving gate electrode 155 is connected with the capacitor plate 158 that is connected with the switching drain electrode 174. The driving source electrode 176 and the other capacitor plate 178 are respectively connected with the common power line 172. The driving drain electrode 177 is disposed at the same layer where the first electrode 710 is disposed, and is connected with the first electrode 710.

In the OLED display 1001 according to the first exemplary embodiment, the driving drain electrode 177 and the first electrode 710 are disposed at the same layer, but a driving drain electrode of an OLED display according to another exemplary embodiment and a first electrode may be disposed at different layers, and the driving drain electrode may be connected to the first electrode through an opening formed in an insulating layer.

With such a structure, the switching thin film transistor 10 is driven by a gate voltage applied to the gate line 151 in order to transmit a data voltage applied to the data line 171 to the driving thin film transistor 20. A voltage corresponding to a difference between a common voltage applied to the driving thin film transistor 20 from the common power line 172 and the data voltage transmitted from the switching thin film transistor 10, is stored in the capacitor 80, and a current corresponding to the voltage stored in the capacitor 80 flows to the organic light emitting diode 300 through the driving thin film transistor 20 such that the organic light emitting diode 300 emits light.

Figure 4:
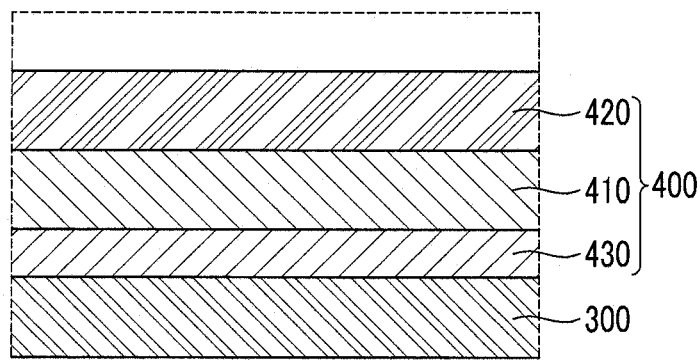
FIG. 4 is an enlarged view of the portion A of FIG. 1.

FIG. 4 is an enlarged view of the portion "A" in FIG. 1.

Referring to FIG. 3 and FIG. 4, the thin film encapsulation layer 400 encapsulates the organic light emitting diodes 300 with the substrate 100, and includes an intermediate layer 430, a first inorganic layer 410, and a second inorganic layer 420. Although the thin film encapsulation layer 400 is shown as a single layer in FIG. 1 for better understanding and ease of description, as shown in FIG. 3 and FIG. 4, the thin film encapsulation layer 400 is formed by layering a plurality of layers.

The intermediate layer 430 and the substrate 100 are arranged on opposite sides of the organic light emitting diodes 300, and the intermediate layer 430 seals the organic light emitting diodes 300 by covering the same. That is, the intermediate layer 430 is disposed between the organic light emitting diodes 300 and the first inorganic layer 410. The intermediate layer 430 has a weaker waterproofing property than the first inorganic layer 410. However, the intermediate layer 430 has flexibility to ease brittleness of the first and second inorganic layers 410 and 420 that have stronger rigidity than the intermediate layer 430. The intermediate layer 430 may have a single-layered structure or a multi-layered structure including a resin such as polyethylene terephthalate (PET), polyimide (PI), and polycarbonate (PC).

In the OLED display 1001 according to the first exemplary embodiment, the intermediate layer 430 includes a resin including at least one of polyethylene terephthalate (PET), polyimide (PI), and polycarbonate (PC). However an intermediate layer of an OLED display according to another exemplary embodiment may be a single layer or multiple layers including an engineering plastic including at least one of glass fiber reinforced plastic (FRP), polyethylene terephthalate (PET), and polymethylmethacrylate (PMMA).

In addition, the intermediate layer 430 in the OLED display 1001 according to the first exemplary embodiment is substantially an organic layer, but according to another exemplary embodiment, it may be a moisture absorbing layer that is capable of absorbing moisture, an optical layer that enhances an optical characteristic of light emitted from the organic light emitting diodes 300, a hole eliminating layer filling holes formed in the first inorganic layer 410, or an adhesive layer enhancing adhesion between the intermediate layer 430 and neighboring layers.

The first inorganic layer 410 seals the organic light emitting diodes 300 and the intermediate layer 430 by covering the same. The first inorganic layer 410 has an excellent waterproof property compared to the intermediate layer 430, and has a first density that is greater than a second density of the second inorganic layer 420 disposed on the first inorganic layer 410.

The second inorganic layer 420 disposed on the first inorganic layer 410 contacts the first inorganic layer 410. Like the first inorganic layer 410, the second inorganic layer 420 seals the organic light emitting diodes 300 and the intermediate layer 430 by covering the same. The second inorganic layer 420 contacts the first inorganic layer 410, and has the second density that is smaller than the first density of the first inorganic layer 410. That is, internal stress of the first inorganic layer 410 is greater than that of the second inorganic layer 420.

As described, while the first inorganic layer 410 and the second inorganic layer 420 are in contact with each other, the first and second inorganic layers 410 and 420 have different densities so that they have different internal stresses. This shows the unique characteristics of the OLED display 1001 that has overall flexibility since the substrate 100 is flexible. In further detail, when the OLED display has flexibility, the thin film encapsulation layer 400 will be subject to stress due to flexing or bending of the substrate 100 so that the inorganic layer formed of a ceramic material may be damaged due to the brittleness of the ceramic material. However, in the OLED display 1001 according to the first exemplary embodiment, the first and second inorganic layers 410 and 420 formed of a ceramic material have different densities while being in contact with each other. Thus, they have different internal stresses so that stresses that are applied to the first and second inorganic layers 410 and 420 are respectively reduced, and accordingly the thin film encapsulation layer 400 can be prevented from being damaged. This functions as a factor for improvement durability of the OLED display 1001 so that the life span of the OLED display 1001 can be improved.

Further, the first inorganic layer 410 and the second inorganic layer 420 contain the same inorganic material selected from at least one of aluminum oxide ($Al_2O_3$), titanium oxide ($TiO_2$), zirconium oxide (ZrO), silicon oxide ($SiO_2$), aluminum oxynitride (AlON), aluminum nitride (AlN), silicon oxynitride (SiON), silicon nitride ($Si_3N_4$), zinc oxide (ZnO), and tantalum oxide ($Ta_2O_5$).

As described, the first inorganic layer 410 and the second inorganic layer 420 include the same inorganic material and therefore have similar refractive indexes. Thus, when light generated from the organic light emitting diodes 300 passes through the thin film encapsulation layer 400 and then is viewed at the outside as an image, deterioration of the image viewed at the outside can be suppressed or reduced. That is, luminous efficiency of the organic light emitting diodes 300 of the OLED display 1001 can be improved.

In addition, the first inorganic layer 410 and the second inorganic layer 420 may be formed through an atomic layer deposition (ALD) process using the same inorganic material as a deposition source.

As described, as the first inorganic layer 410 and the second inorganic layer 420 may be formed through the ALD process using the same inorganic material as a deposition source, a plurality of inorganic layers may be formed in a single chamber that performs the ALD process without moving the substrate 100, which is a target of deposition. Thus, contamination that may occur during the deposition process can be suppressed or reduced by minimizing or reducing the number of movements of the substrate 100 compared to a process for forming a plurality of inorganic layers using different deposition processes. Further, a manufacturing time and manufacturing cost for forming the thin film encapsulation layer 400 can be further reduced compared to a process for forming a plurality of inorganic layers using different deposition processes. That is, the manufacturing time and manufacturing cost of the OLED display 1001 can be reduced.

The thin film encapsulation layer 400 of the OLED display 1001 according to the first exemplary embodiment includes the first and second inorganic layers 410 and 420, but a thin film encapsulation layer of an OLED display according to another exemplary embodiment may include third, fourth, and fifth inorganic layers that are sequentially layered on a second inorganic layer and respectively have different densities.

Hereinafter, a manufacturing method of an OLED display according to a second exemplary embodiment will be described with reference to FIG. 5 and FIG. 6.

The OLED display 1001 according to the first exemplary embodiment may be manufactured using the manufacturing method of the OLED display according to the second exemplary embodiment.

Figure 5:
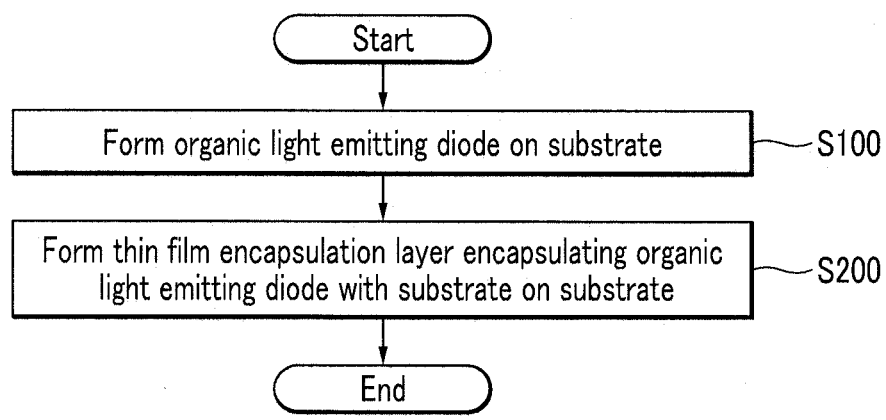
FIG. 5 is a flowchart of a manufacturing process of an OLED display according to a second exemplary embodiment.

FIG. 5 is a flowchart of the manufacturing method of the OLED display according to the second exemplary embodiment.

First, the organic light emitting diodes 300 are formed on the substrate 100 (S100).

In addition, a wiring portion 200 and the organic light emitting diodes 300 are formed on the substrate 100. The wiring portion 200 may be formed through a photolithography process, and the organic light emitting diodes 300 may be formed through the photolithography process and a deposition process using a mask.

Next, the thin film encapsulation layer 400 that encapsulates the organic light emitting diodes 300 and the substrate 100, is formed on the substrate 100 (S200).

In more detail, the intermediate layer 430 is formed on the substrate 100 using a coating process, and then the first inorganic layer 410 and the second inorganic layer 420 are sequentially formed on the intermediate layer 430 through an ALD process. The first inorganic layer 410 and the second inorganic layer 420 are respectively formed at different temperatures such that they have different densities and different internal stresses, and the reason for the difference therebetween will be described in more detail hereinafter.

Figure 6:
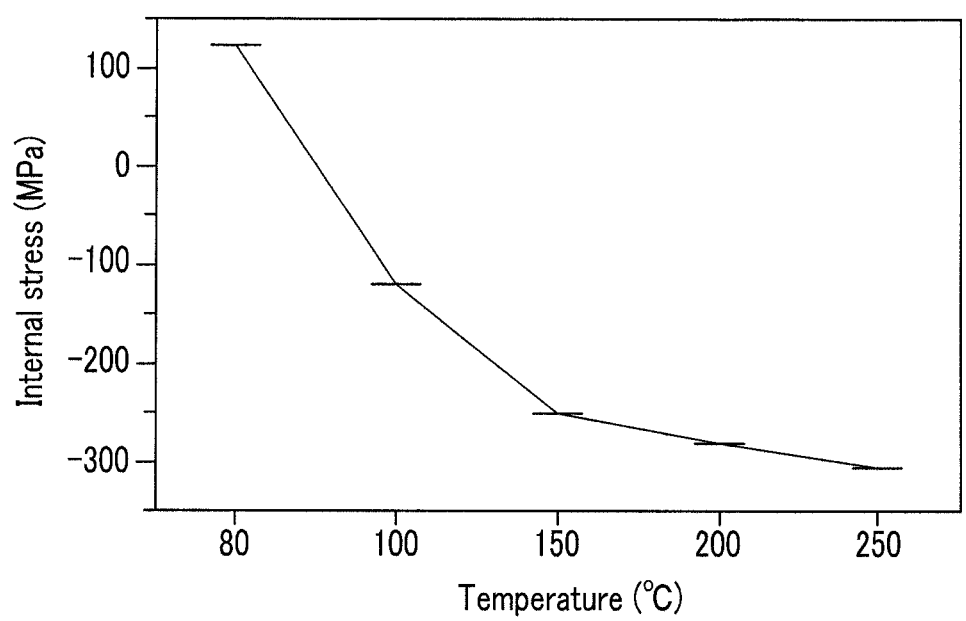
FIG. 6 is a graph for describing the manufacturing method of the OLED display according to the second exemplary embodiment.

FIG. 6 is a graph for describing the manufacturing method of the OLED display according to the second exemplary embodiment.

FIG. 6 is a graph showing internal stresses of an inorganic layer measured at different temperatures during the formation of the inorganic layer that includes aluminum oxide ($Al_2O_3$) using the ALD process within the temperature range of 80° C. to 250° C. In FIG. 6, the x-axis indicates the temperature environment during the ALD process, and the y-axis indicates the internal stress of the inorganic layer formed through the ALD process.

As shown in FIG. 6, while the inorganic layer is formed using the ALD process, the internal stress of the inorganic layer is decreased as the temperature is increased. That is, although a plurality of inorganic layers are formed through the same ALD process, each of the inorganic layers may have a different internal stress when a temperature environment during the formation of each of the inorganic layers is set to be different from each other. It will be understood that such a characteristic can be observed not only when aluminum oxide ($Al_2O_3$) is used. The above characteristic is caused by entropy that changes according to temperature and is therefore also observed when at least one of titanium oxide ($TiO_2$), zirconium oxide (ZrO), silicon oxide ($SiO_2$), aluminum oxynitride (AlON), aluminum nitride (AlN), silicon oxynitride (SiON), silicon ditride ($Si_3N_4$), zinc oxide (ZnO), or tantalum oxide ($Ta_2O_5$) is used as a deposition source in the ALD process.

Thus, in the manufacturing method of the OLED display according to the second exemplary embodiment, the first inorganic layer 410 is formed at a first temperature through the ALD process using the inorganic material including at least one of aluminum oxide ($Al_2O_3$), titanium oxide ($TiO_2$), zirconium oxide (ZrO), silicon oxide ($SiO_2$), aluminum oxynitride (AlON), aluminum nitride (AlN), silicon oxynitride (SiON), silicon nitride ($Si_3N_4$), zinc oxide (ZnO), or tantalum oxide ($Ta_2O_5$), and the second inorganic layer 420 is formed to contact the first inorganic layer 410 at a second temperature that is higher than the first temperature such that the internal stress of the first inorganic layer 410 is higher than that of the second inorganic layer 420. That is, since the first temperature, that is a temperature environment at which the first inorganic layer 410 is formed, is lower than the second temperature, that is a temperature environment at which the second inorganic layer 420 is formed during the ALD process, the first density of the first inorganic layer 410 is greater than the second density of the second inorganic layer 420 so that the internal stress of the first inorganic layer 410 becomes higher than that of the second inorganic layer 420.

As described, the first inorganic layer 410 is formed in the first temperature environment, and then the second inorganic layer 420 is formed in the second temperature environment such that the first inorganic layer 410 and the second inorganic layer 420 contact each other while respectively having different densities. Thus, the first inorganic layer 410 and the second inorganic layer 420 have different internal stresses. Accordingly, a stress that is generated from each of the first and second inorganic layers 410 and 420 is eased, thereby suppressing damage to the thin film encapsulation layer 400. This functions as a factor for improving durability of the OLED display 1001 so that the life span of the OLED display 1001 can be improved according to the manufacturing method of the present exemplary embodiment.

Further, the first inorganic layer 410 and the second inorganic layer 420 are respectively formed using the same inorganic material so that the first and second inorganic layers 410 and 420 have similar refractive indexes, and accordingly when light generated from the organic light emitting diodes 300 passes through the thin film encapsulation layer 400 and is viewed as an image at the outside, deterioration of the image can be suppressed or reduced. That is, according to the manufacturing method of the OLED display, light efficiency of the organic light emitting diode 300 can be improved.

Further, since the first inorganic layer 410 and the second inorganic layer 420 are formed through the ADL process using the same inorganic material as a deposition source, a plurality of inorganic layers (i.e., the first and second inorganic layers 410 and 420) can be formed without moving the substrate 100, which is a target of deposition in one chamber where the ALD process is performed, so that the number of movements of the substrate 100 can be minimized compared to a process for forming a plurality of inorganic layers using different deposition processes. Thus, contamination that may occur during a deposition process can be suppressed or reduced compared to the process for forming the plurality of inorganic layers using respectively different deposition processes, and time and cost for forming the thin film encapsulation layer 400 may be reduced. That is, according to the manufacturing method of the OLED display of the present exemplary embodiment, the manufacturing time and manufacturing cost of the OLED display may be reduced.

An OLED display according to a third exemplary embodiment will be described with reference to FIG. 7.

In the third exemplary embodiment, for better comprehension and ease of description, constituent elements identical to or corresponding to those according to the first exemplary embodiment are denoted by the same reference numerals.

Figure 7:
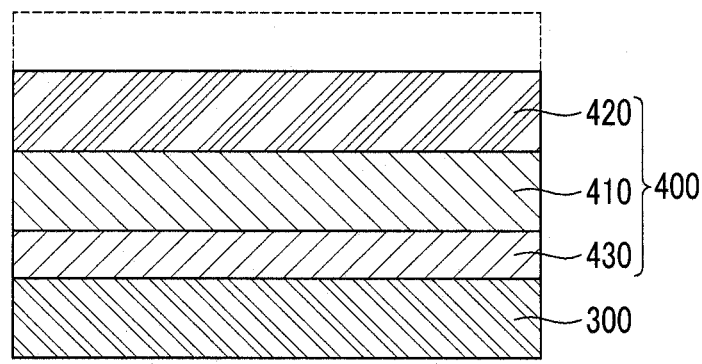
FIG. 7 shows a configuration of an OLED display according to a third exemplary embodiment.

FIG. 7 shows the configuration of the OLED display according to the third exemplary embodiment.

As shown in FIG. 7, a thin film encapsulation layer 400 of an OLED display 1003 according to the third exemplary embodiment encapsulates organic light emitting diodes 300, and includes a first inorganic layer 410, a second inorganic layer 420, and an intermediate layer 430.

The first inorganic layer 410 has a first density that is smaller than a second density of the second inorganic layer 420 that is disposed on the first inorganic layer 410. That is, the second density of the second inorganic layer 420 is greater than that of the first inorganic layer 410, and an internal stress of the second inorganic layer 420 is greater than that of the first inorganic layer 410.

As described, the first inorganic layer 410 and the second inorganic layer 420 respectively have different internal stresses by having different densities so that a stress generated from each of the first and second inorganic layers 410 and 420 is eased, and accordingly damage to the thin film encapsulation 400 is suppressed or reduced. This functions as a factor for improvement durability of the OLED display 1003 so that the life span of the OLED display 1003 may be improved.

Hereinafter, a manufacturing method of an OLED display according to a fourth exemplary embodiment will be described. The OLED display 1003 according to the third exemplary embodiment may be manufactured by the manufacturing method of the OLED display according to the fourth exemplary embodiment.

Hereinafter, only characteristic portions that are different from the second exemplary embodiment are described, and undescribed portions will be appreciated by referring to the second exemplary embodiment.

First, the organic light emitting diodes 300 are formed on the substrate 100.

Next, the thin film encapsulation layer 400 that encapsulates the organic light emitting diodes 300 with the substrate 100 is formed on the substrate 100.

Here, the first inorganic layer 410 is formed in a first temperature environment, and the second inorganic layer 420 is formed in a second temperature environment through an ALD process using the same inorganic material as a deposition source so as to make the internal stress of the second inorganic layer 420 greater than that of the first inorganic layer 410. Here, the first temperature is higher than the second temperature, and the second inorganic layer 420 contacts the first inorganic layer 410. That is, since the second temperature, that is a temperature environment at which the second inorganic layer 420 is formed, is lower than the first temperature, that is a temperature environment at which the first inorganic layer 410 is formed, the second density of the second inorganic layer 420 is greater than the first density of the first inorganic layer 410 so that the internal stress of the second inorganic layer 420 is greater than that of the first inorganic layer 410.

As described, since the first inorganic layer 410 is formed in the first temperature environment and the second inorganic layer 420 is formed in the second temperature environment, and thus the first and second inorganic layers 410 and 420 respectively have different densities while being in contact with each other, the internal stress of the first inorganic layer 410 is different from that of the second inorganic layer 420.

Accordingly, stresses that occur in the first and second inorganic layers 410 and 420 are respectively eased, thereby preventing the thin film encapsulation layer 400 from being damaged due to the stresses. This functions as a factor for improving the durability of the OLED display 1003 so that the life-span of the OLED display 1003 may be improved.

Hereinafter, an OLED display according to a fifth exemplary embodiment will be described with reference to FIG. 8.

In the fifth exemplary embodiment, for better comprehension and ease of description, constituent elements identical to or corresponding to those according to the first exemplary embodiment are denoted by the same reference numerals.

Figure 8:
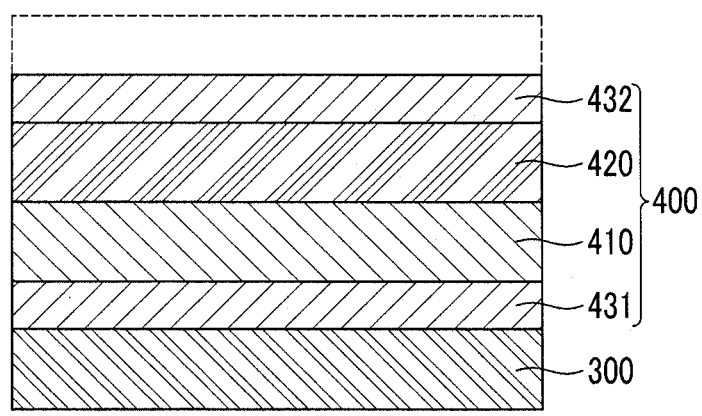
FIG. 8 shows a configuration of an OLED display according to a fifth exemplary embodiment.

FIG. 8 shows the configuration of the OLED display according to the fifth exemplary embodiment.

As shown in FIG. 8, a thin film encapsulation layer 400 of an OLED display 1005 according to the fifth exemplary embodiment encapsulates organic light emitting diodes 300, and includes a first intermediate layer 431, a second intermediate layer 432, a first inorganic layer 410, and a second inorganic layer 420.

The first intermediate layer 431 faces a substrate 100, having the organic light emitting diode 300 interposed therebetween, and seals the organic light emitting diodes 300 by covering the same. That is, the first intermediate layer 431 is disposed between the organic light emitting diodes 300 and the first inorganic layer 410.

The second intermediate layer 432 is disposed on the second inorganic layer 420. The second intermediate layer 432 may function to prevent the second inorganic layer 420 from being damaged due to external interference, may function to help another layer that may be attached on the second intermediate layer 432 to adhere to the second inorganic layer 420, or may function to enhance optical characteristics of light emitted from the organic light emitting diodes 300.

Hereinafter, a manufacturing method of the OLED display according to a sixth exemplary embodiment will be described. The OLED display 1005 according to the fifth exemplary embodiment may be manufactured by the manufacturing method of the OLED display according to the sixth exemplary embodiment.

In the sixth exemplary embodiment, for better comprehension and ease of description, constituent elements identical to or corresponding to those according to the second exemplary embodiment are denoted by the same reference numerals.

First, the organic light emitting diodes 300 are formed on the substrate 100.

Next, the thin film encapsulation layer 400 that encapsulates the organic light emitting diodes 300 and the substrate 100 is formed on the substrate 100.

Here, the first intermediate layer 431, the first inorganic layer 410, and the second inorganic layer 420 are sequentially layered on the organic light emitting diodes 300, and then the second intermediate layer 432 is formed on the second inorganic layer 420 using a coating process.

Hereinafter, an OLED display according to a seventh exemplary embodiment will be described with reference to FIG. 9.

In the seventh exemplary embodiment, for better comprehension and ease of description, constituent elements identical to or corresponding to those according to the first exemplary embodiment are denoted by the same reference numerals.

Figure 9:
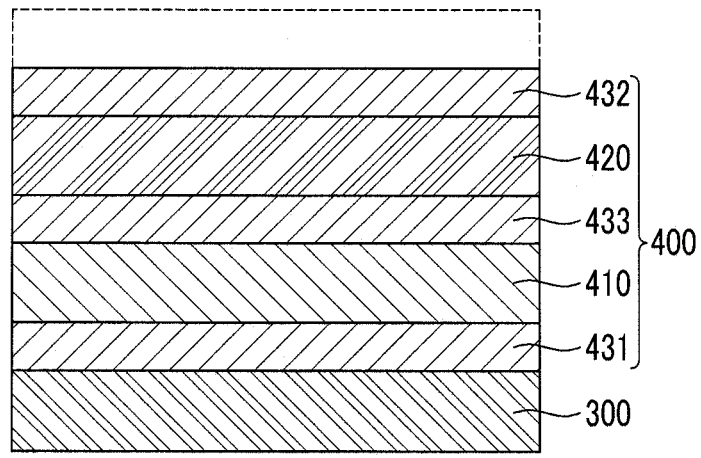
FIG. 9 shows a configuration of an OLED display according to a seventh exemplary embodiment.

FIG. 9 shows the configuration of the OLED display according to the seventh exemplary embodiment.

As shown in FIG. 9, a thin film encapsulation layer 400 of an OLED display 1007 according to the seventh exemplary embodiment encapsulates organic light emitting diodes 300, and includes a first intermediate layer 431, a second intermediate layer 432, a third intermediate layer 433, a first inorganic layer 410, and a second inorganic layer 420.

The first intermediate layer 431 faces a substrate 100, having the organic light emitting diodes 300 interposed therebetween, and seals the organic light emitting diodes 300 by covering the same. That is, the first intermediate layer 431 is disposed between the organic light emitting diodes 300 and the first inorganic layer 410.

The second intermediate layer 432 is disposed on the second inorganic layer 420. The second intermediate layer 432 may function to prevent the second inorganic layer 420 from being damaged due to external interference, may function to help another layer that may be attached on the second intermediate layer 432 to adhere to the second inorganic layer 420, or may function to enhance optical characteristics of light emitted from the organic light emitting diodes 300.

The third intermediate layer 433 is disposed between the first inorganic layer 410 and the second inorganic layer 420. The third intermediate layer 433 may function to help the first inorganic layer 410 to be adhered with the second inorganic layer 420, may function to ease respective stresses of the first and second inorganic layers 410 and 420, or may function to enhance optical characteristics of light emitted from the organic light emitting diodes 300.

Hereinafter, a manufacturing method of an OLED display according to an eighth exemplary embodiment will be described. The OLED display 1007 according to the seventh exemplary embodiment may be manufactured by the manufacturing method of the OLED display according to the eighth exemplary embodiment.

In the eighth exemplary embodiment, for better comprehension and ease of description, constituent elements identical to or corresponding to those according to the second exemplary embodiment are denoted by the same reference numerals.

First, the organic light emitting diodes 300 are formed on the substrate 100.

Next, the thin film encapsulation layer 400 that encapsulates the organic light emitting diodes 300 and the substrate 100 is formed on the substrate 100.

Here, the first intermediate layer 431 and the first inorganic layer 410 are sequentially layered on the organic light emitting diodes 300, and then the third intermediate layer 433 is formed on the first inorganic layer 410 using a coating process or a deposition process. After that, the second inorganic layer 420 and the second intermediate layer 432 are sequentially formed on the third intermediate layer 433.

Hereinafter, an OLED display 1009 according to a ninth exemplary embodiment will be described with reference to FIG. 10.

In the ninth exemplary embodiment, for better comprehension and ease of description, constituent elements identical to or corresponding to those according to the first exemplary embodiment are denoted by the same reference numerals.

Figure 10:
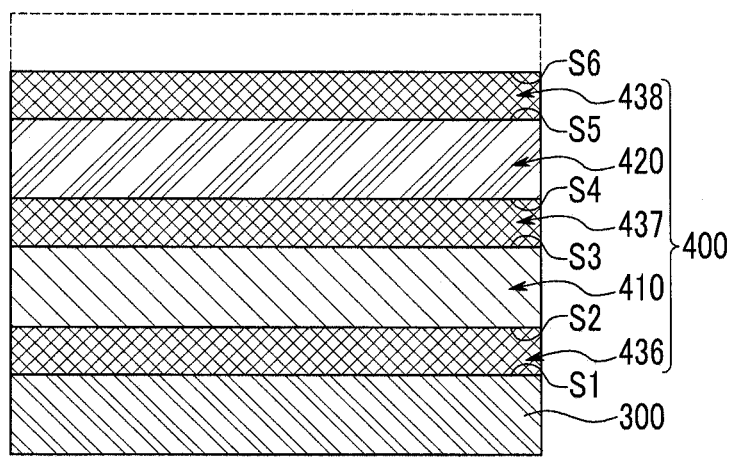
FIG. 10 shows a configuration of an OLED display according to a ninth exemplary embodiment.

FIG. 10 shows the configuration of the OLED display according to the ninth exemplary embodiment.

As shown in FIG. 10, a thin film encapsulation layer 400 of the OLED display 1009 according to the ninth exemplary embodiment encapsulates organic light emitting diodes 300, and includes a first inorganic layer 410, a second inorganic layer 420, a sixth intermediate layer 436, a seventh intermediate layer 437, and an eighth intermediate layer 438.

The sixth intermediate layer 436 faces a substrate 100, the organic light emitting diodes 300 being interposed therebetween, and seals the organic light emitting diodes 300 by covering the same. That is, the sixth intermediate layer 436 is disposed between the organic light emitting diodes 300 and the first inorganic layer 410. The sixth intermediate layer 436 has a first surface S1 that contacts the organic light emitting diodes 300 and a second surface S2 that contacts the first inorganic layer 410. The density of the sixth intermediate layer 436 gradually changes from that of the second surface S2 to the first density of the first surface S1.

The seventh intermediate layer 437 is disposed between the first inorganic layer 410 and the second inorganic layer 420. The seventh intermediate layer 437 has a first surface S3 that contacts the first inorganic layer 410 and a second surface S4 that contacts the second inorganic layer 420. The density of the seventh intermediate layer 437 gradually changes from the first density of the first surface S3 to the second density of the second surface S4.

The eighth intermediate layer 438 is disposed on the second inorganic layer 420. The eighth intermediate layer 438 has a first surface S5 that contacts the second inorganic layer 420 and a second surface S6 that is exposed to the outside. The density of the eighth intermediate layer 438 gradually changes from a first density of the first surface S5 to a second density of the second surface S6.

The sixth intermediate layer 436, the seventh intermediate layer 437, and the eighth intermediate layer 438 include the same inorganic material as that of the first and second inorganic layers 410 and 420, and are formed using an ALD process like the first inorganic layer 410 and the second inorganic layer 420.

As described, in the OLED display 1009 according to the ninth exemplary embodiment, each of the sixth intermediate layer 436, the seventh intermediate layer 437, and the eighth intermediate layer 438 has a density that gradually changes from a value that is the same as that of a neighboring inorganic layer to another value that is the same as the other neighboring inorganic layer. Therefore, each of the sixth intermediate layer 436, the seventh intermediate layer 437, and the eighth intermediate layer 438 has an internal stress that gradually changes from a value that is the same as that of a neighboring inorganic layer to another value that is the same as the other neighboring inorganic layer. Accordingly, stresses can be eased among the organic light emitting diodes 300, the first inorganic layer 410, and the second inorganic layer 420 that have different internal stresses. Accordingly, the impact resistance is improved so that the life-span of the OLED display 1009 may be improved.

Hereinafter, a manufacturing method of an OLED display according to a tenth exemplary embodiment will be described. The OLED display 1009 according to the ninth exemplary embodiment may be manufactured by the manufacturing method of the OLED display according to the tenth exemplary embodiment.

In the tenth exemplary embodiment, for better comprehension and ease of description, constituent elements identical or corresponding to those according to the second exemplary embodiment are denoted by the same reference numerals.

First, the organic light emitting diodes 300 are formed on the substrate 100.

Next, the thin film encapsulation layer 400 that encapsulates the organic light emitting diodes 300 and the substrate 100 is formed on the substrate 100.

Here, using an ALD process that uses the same inorganic material for forming the first and second inorganic layers 410 and 420 on the organic light emitting diodes 300 as a deposition source, the sixth intermediate layer 436 is formed in a first temperature environment in which the temperature is gradually changed from the first surface S1 that faces the organic light emitting diodes 300 to a first temperature at the second surface S2. The first inorganic layer 410 is formed on the sixth intermediate layer 436 to contact the second surface S2 of the sixth intermediate layer 436 in an environment maintaining the first temperature. The seventh intermediate layer 437 is formed in a second temperature environment in which the temperature is gradually changed from the first temperature from the first surface S3 that faces the first inorganic layer 410 to a second temperature at the second surface S4. The second inorganic layer 420 is formed on the seventh intermediate layer 437 to contact the second surface S4 of the seventh intermediate layer 437. Then, the eighth intermediate layer 438 is formed in another temperature environment in which the temperature is gradually changed from the second temperature from the first surface S5 that contacts the second inorganic layer 420 to another temperature at the second surface S6 to be exposed to the outside.

As described, according to the manufacturing method of the OLED display of the tenth exemplary embodiment, each of the sixth intermediate layer 436, the seventh intermediate layer 437, and the eight intermediate layer 438 is formed in a temperature environment that gradually changes from a value that is the same as that of a neighboring inorganic layer to another value that is the same as the other neighboring inorganic layer. Therefore, the density of each of the sixth, seventh, and eighth intermediate layers 436, 437, and 438 gradually changes from a value that is the same as that of a neighboring inorganic layer to another value that is the same as the other neighboring inorganic layer. Accordingly, each of the sixth, seventh, and eighth intermediate layers 436, 437, and 438 has the same internal stress as that of the neighboring inorganic layer from one surface to the other surface. Thus, according to the manufacturing method of the OLED display of the present exemplary embodiment, the internal stresses of the organic light emitting diodes 300, the first inorganic layer 410, and the second inorganic layer 420 that respectively have different internal stresses are eased so that the impact resistance of the OLED display 1009 is enhanced, thereby improving the life-span of the OLED display 1009.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting diode (OLED) display comprising:
   a substrate;
   an organic light emitting diode on the substrate; and
   a thin film encapsulation layer comprising a first inorganic layer having a first density on the substrate and a second inorganic layer having a second density on the first inorganic layer, the second density being different from the first density, and the organic light emitting diode being encapsulated between the thin film encapsulation layer and the substrate,
   wherein the thin film encapsulation layer further comprises an intermediate layer between the first inorganic layer and the second inorganic layer,
   wherein the intermediate layer is a single layer,
   wherein the intermediate layer has a first surface contacting the first inorganic layer and a second surface contacting the second inorganic layer, and
   wherein the intermediate layer has a density that gradually changes from the first density at the first surface to the second density at the second surface.

2. The OLED display of claim 1, wherein the first inorganic layer and the second inorganic layer comprise a same inorganic material.

3. The OLED display of claim 2, wherein the inorganic material comprises at least one material selected from the group consisting of aluminum oxide ($Al_2O_3$), titanium oxide ($TiO_2$), zirconium oxide (ZrO), silicon oxide ($SiO_2$), aluminum oxynitride (AION), aluminum nitride (AIN), silicon oxynitride (SiON), silicon nitride ($Si_3N_4$), zinc oxide (ZnO), tantalum oxide ($Ta_2O_5$), and combinations thereof.

4. The OLED display of claim 1, wherein the first-density is greater than the second density, and internal stress of the first inorganic layer is greater than that of the second inorganic layer.

5. The OLED display of claim 1, wherein the second density is greater than the first density, and internal stress of the second inorganic layer is greater than that of the first inorganic layer.

6. The OLED display of claim 1, wherein the intermediate layer comprises an inorganic material that is the same as that of the first and second inorganic layers.

7. The OLED display of claim 1, wherein each of the first and second inorganic layers is formed through an ALD process.

* * * * *